United States Patent [19]

Addamiano

[11] Patent Number: 4,614,672
[45] Date of Patent: Sep. 30, 1986

[54] LIQUID PHASE EPITAXY (LPE) OF SILICON CARBIDE

[75] Inventor: Arrigo Addamiano, Alexandria, Va.

[73] Assignee: The United States of America as represented by the Secretary of the Navy, Washington, D.C.

[21] Appl. No.: 741,784

[22] Filed: Jun. 6, 1985

[51] Int. Cl.⁴ ............................................ C23C 16/32
[52] U.S. Cl. ..................................... 427/249; 427/85; 427/93; 427/240; 427/255; 427/344; 427/346; 427/430.1
[58] Field of Search ................. 427/249, 255, 344, 85, 427/346, 93, 352, 402, 240, 430.1, 397.7; 428/446

[56] References Cited

U.S. PATENT DOCUMENTS 4,161,743  7/1979  Yonezawa et al. .................... 427/93
4,207,482  6/1980  Neumeyer et al. ................. 428/446

FOREIGN PATENT DOCUMENTS 54-43200  4/1979  Japan ..................................... 427/93

OTHER PUBLICATIONS

"Production of Large-Area Single-Crystal Wafers of Cubic SiC for Semiconductor Devices", Nishino et al.
"Buffer-Layer" Technique for the Growth of Single Crystal SiC on Si, Addamiano et al.
"Epitaxial Growth of SiC Layers", R. W. Brander.

*Primary Examiner*—Sadie L. Childs
*Attorney, Agent, or Firm*—Robert F. Beers; Sol Sheinbein; Ansel M. Schwartz

[57] ABSTRACT

A method for making cubic SiC devices comprising the steps of preparing a preform consisting of high purity Si on which a layer of cubic SiC has been deposited by CVD; transferring the preform to a furnace containing a molten bath of Si saturated with SiC at a temperature of between 1600°–1800° C., the saturation being insured by the use of a high purity graphite crucible for the Si; dipping the Si-SiC preform into the molten bath and allowing deposition of more cubic SiC on the SiC layer by reducing the temperature of the already formed cubic SiC layer from the preparing step in relation to the rest of the molten bath.

15 Claims, 2 Drawing Figures

LIQUID PHASE EPITAXY (LPE) OF SILICON CARBIDE

BACKGROUND OF THE INVENTION

A technique for the liquid phase epitaxy of SiC was first reported by R. W. Brander (2nd Intern. Conf. on SiC, State College, Pa. 1968, p. 187) (publ. 1969) and more recently by Japanese workers (A. Suzuki et al., J. Appl. Phys. 47, 4546 (1976); M. Ikeda et al., J. Appl. Phys. 50, 8217 (1979)). A crystal of hexagonal silicon carbide, (usually of the crystal symmetry of 6H SiC; a six layer structure) is dipped in a melt of silicon saturated with silicon carbide at temperatures above 1500° C. (the melting point of silicon is about 1420° C.). If the 6H SiC substrate is slightly colder than the rest of the liquid, a thin layer of 6H SiC may deposit epitaxially on the 6H SiC substrate. Thus, in theory an LPE technique for the preparation of silicon carbide devices, e.g., p-n junctions, exists. In practice, however, no 6H SiC devices are commercially made by this technique. This state of affairs is essentially due to the fact that good single crystal substrates of 6H SiC are not commercially available. Moreover, laboratory made crystals are usually twinned, and each 6H SiC cystal is different from all the others.

The present invention concerns a new technique that avoids the aforementioned shortcomings and results in cubic epitaxial SiC layers and devices of a type similar to that developed by Brander, supra. However, the following important differences exist: (1) the substrates are made of cubic SiC, not of hexagonal SiC, (the optical band gap of cubic SiC is 2.39 electron volts, vs 3.02 electron volts for 6H SiC - a very considerable difference) (2) the cubic SiC substrates are in the form of thin layers formed by chemical vapor deposition (CVD) on silicon substrates of different orientation, (100), (111), etc. They are not unsupported single crystals. (3) The thickness and the area of the cubic SiC layers deposited on the Si substrates can be controlled at will, (4) no grinding and polishing of the [CVD]SiC—on -Si substrates (preforms) prior to LPE is required, (5) the electrical properties (and other properties) of the Si-supported-SiC-substrates can be tailored at will, and (6) most importantly, the area of the silicon and of the cubic SiC layers formed upon them for use as substrates can be large enough to fit the needs of mass production techniques of SiC devices.

SUMMARY OF THE INVENTION

Accordingly, one object of the present invention is to provide a method for producing very pure large-area cubic SiC substrates that fit the needs of mass production techniques of SiC devices, i.e., that is reproducible and allows for precise control of the growth of the cubic SiC substrate layer.

Another object of the present invention is to provide a method for producing very pure cubic SiC structures that are of a large area and which fit the needs of mass production techniques of SiC devices, that are reproducible, and allow for precise fabrication of cubic SiC homojunctions.

These and other objects can be achieved with a method for making cubic SiC devices comprising the steps of:

preparing a two-layer structure consisting of high purity Si on which a layer of cubic SiC has been deposited; transferring the two-layer (Si-SiC) structure (preform) to a furnace containing a molten bath of Si saturated with SiC at a temperature of between 1600°-1800° C., the saturation being insured by the use of a high purity crucible made of carbon as a container for the molten Si; dipping the Si-SiC preform into the molten bath and allowing deposition of one more cubic SiC layer on the SiC layer of the preform by reducing the temperature of the preform between 20°-50° C. relative to the molten Si.

Additional steps include adding P- or N-type dopants to the molten bath or during the CVD process, and repeating the LPE process to create multiple cubic SiC homojunctions; and eliminating any Si adhering to the surface of the cubic SiC layer (and multilayer) structures.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
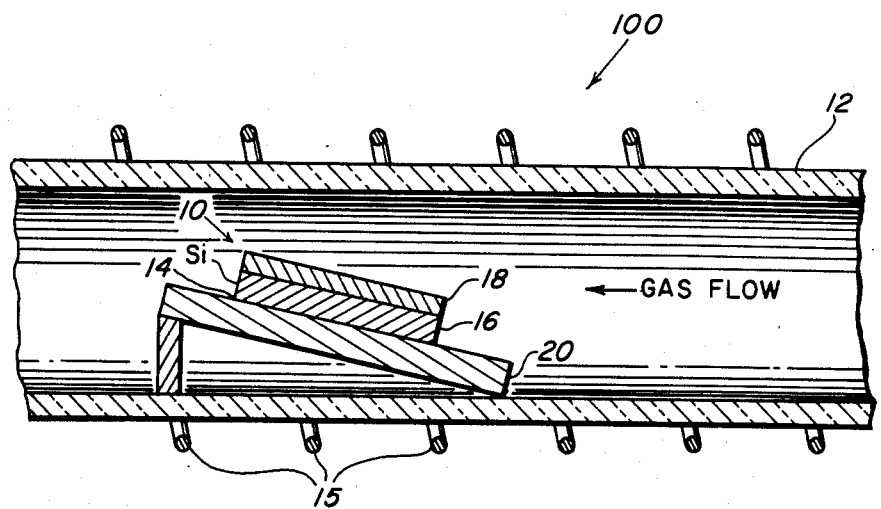
FIG. 1 is a side view of the apparatus for cubic SiC growth via the CVD process.

Referring now to the drawings, wherein like reference numerals designate identical or corresponding parts throughout the several views, and more particularly to FIG. 1 thereof, there is shown a Si wafer of structure (100), e.g., for the preparation of a preform 10 comprised of a layer of cubic SiC 18 deposited atop a highly pure wafer of Si 16. The Si layer 16 during the preparation of the preform is rested atop a graphite susceptor 20 located inside a fused quartz tube 12 and surrounded by an induction coil 15. The induction coil raises the temperature of the graphite susceptor near the Si wafer to about 1400° C. causing a gas mixture of, for instance, $H_2 + SiH_4 + C_3H_8$ that has been introduced upstream into the tube 12, to chemically react and deposit the layer of cubic SiC 18 on the Si wafer 16.

Figure 2:
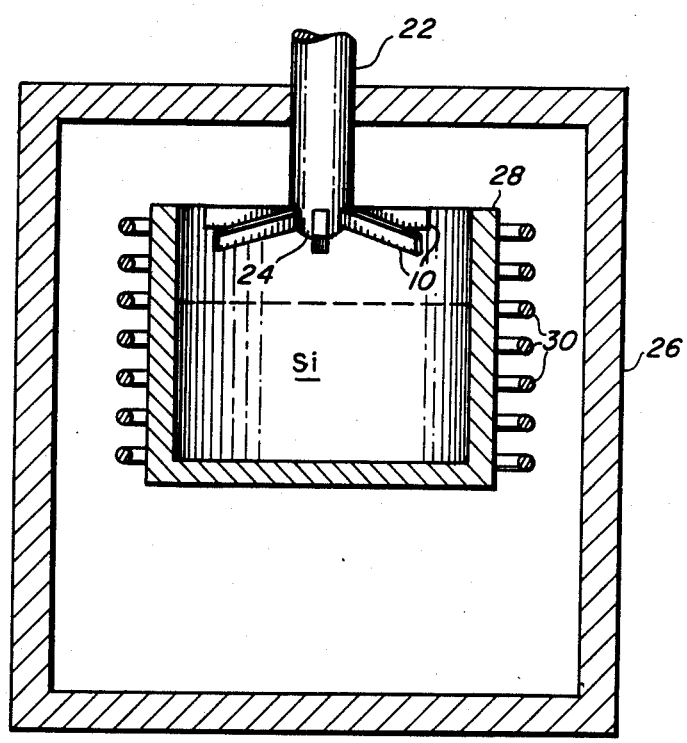
FIG. 2 is a side view of the LPE apparatus with the graphite crucible and spindle wherein the LPE process for cubic SiC growth is carried out.

FIG. 2 shows a spindle 22 with several preforms 10 attached to it. The spindle 22 is located, and can move up and down and rotate, inside a steel vessel 26 which contains a graphite crucible 28 holding high purity Si. Surrounding the crucible 28 is an inductor coil 30 for melting the Si in the crucible 28. The melted Si reacts chemically with the graphite crucible to form SiC, which is dissolved in the excess molten Si. With the crucible 28 at 1600° C. or more, the preforms 10 attached to the spindle 22 are dipped into the molten Si saturated with SiC whereupon cubic SiC condenses onto the already formed cubic SiC layer 18 attached to the spindle 22.

Specifically, the first step in the production of cubic SiC devices is the preparation of preforms 10 made of high purity Si on which a layer of cubic SiC has been deposited by, for instance, a technique such as chemical vapor deposition (hereafter, CVD). The CVD process is but an initial step in the present process. The CVD process step is explained in detail by A. Addamiano and J. A. Sprague, "Buffer-layer technique for the growth of single crystal SiC on Si", Appl. Phys. Lett., vol. 44, number 5, page 525–527, 1 March 1984, and S. Nishino, J. A. Powell, and H. A. Will, Appl. Phys. Lett., vol. 42, page 460, March 1983. During the CVD step, a gas mixture of, for instance, 1.4 liters per minute of $H_2$, 0.2 milliliters per minute of $C_3H_8$ and 0.6 milliliters per minute of $SiH_4$ is allowed to flow in a reaction tube 12 of about 35 millimeters in diameter. The temperature around the Si wafer 14, upon which the cubic SiC layer forms, is 1400° C., for instance. A (100) Si wafer 16, for example, is used for the deposition of the cubic SiC layer 18. The CVD step is continued until a thick enough cubic SiC layer has grown to be structurally secure. Preferrably this should be around 10 microns thick, or more (i.e. 4–8 hr deposition time, or more).

One preferred way of forming the layer of cubic SiC 18 on the wafer of Si 16 is by placing the wafer 16 in a groove cut into the graphite susceptor 20 so one edge of the wafer abuts against the side of the groove. The CVD process is carried out and cubic SiC is deposited on all the exposed sides of the Si wafer 16. The CVD is discontinued and the wafer 16 is flipped over and positioned in the same way on the susceptor 20. The CVD process is continued causing cubic SiC to coat the newly exposed side of the wafer 16. In this way, the wafer 16 is coated with cubic SiC except for the one edge that abuts the edge of the groove in the suseptor 20. When the preform 10 is attached to the spindle 22, the uncoated edge of the preform is allowed to remain uncovered so when the Si wafer 16 in the preform 30 melts, the molten Si may pour out of the preform 10, but the SiC layers of preform 10 will remain structurally secure.

After the CVD process is finished, the two layer preform is allowed to cool to room temperature and it is then removed from the susceptor layer 20. The preform (or many preforms) is (are) then attached to a spindle 22. When attaching the preforms 12 to the spindle 22 space should be left between the individual preforms 12 to allow free liquid flow therebetween.

The spindle 22 with the preforms attached thereto is then inserted into the high temperature vessel 26, having preferably about one atmosphere pressure of argon or hydrogen therein, although other inert atmospheres (free of $N_2$ or $O_2$) can be used. Also, in the steel container 26 is a graphite crucible 28 containing high purity Si. The crucible 28 is surrounded by an induction coil 30.

After the spindle 22 loaded with the preforms is assembled inside the container 26 (the opening through which the spindle 22 enters the container 26 should have a seal around it to prevent the escape of any hydrogen or argon gas located within the container 26), the induction coil 30 is turned on and the Si in the crucible 20 is melted. The temperature in the crucible should be between 1600° C. and 1800° C. and preferably 1700° C. The molten Si will chemically react with the graphite walls of the crucible 28 causing SiC to also exist in the molten Si.

The loaded spindle 22 is there inserted into the molten Si saturated by SiC in the crucible. A layer of cubic SiC will condense on the layer of cubic SiC of the preforms since the spindle extends out of the container 26 and acts as a heat sink, causing the spindle and the cubic SiC layers attached thereto to be at a lower temperature than the mass of molten Si saturated by SiC. When the dissolved SiC solidifies on the cubic SiC layer 18 attached to the spindle 22 it forms cubic SiC also. This is because under the conditions present in the container 26, the cubic SiC layers 18 act as seeds that cause the SiC dissolved in the pure Si to duplicate the crystal pattern that already exists when it condenses and crystallizes on the SiC layers 18. While the spindle is inserted in the molten Si saturated by SiC, it should be rotated very slowly to allow a more homogeneous deposition (1–5 revolution per hour). In this manner, a smooth layer of cubic SiC will grow on the cubic SiC seed layer 18 in a controlled manner. The time it takes to grow the additional cubic SiC layers on the cubic SiC layer 28 is anywhere from a couple minutes to a few hours depending on the thickness of cubic SiC desired. After, for example, 10 microns of cubic SiC has grown on each side of the layer 18 the spindle 22 is removed from the molten Si saturated by SiC at 1600°–1800° C. (as chosen).

Any globs of Si adhering to the cubic SiC layer can be removed by 3 methods. These methods are: by rotating or centrifuging the spindle while hot utilizing the centrifugal force to cause the globs to come off. Raising the temperature around the spindle 22 now above the crucible 28, for instance, to 1750° and causing the Si globs to melt off. Or lastly dipping the cubic SiC layer with Si globs in hydrofluoric acid, or $HF+HNO_3$ mixtures which reacts with Si, but not SiC, and rinsing with $H_2O$ the SiC layers.

The above procedure describes a way to produce large-area highly pure cubic SiC that is highly controllable, and reproducible. This procedure can be used to produce semiconductor devices on substrates that are large enough to meet the needs of mass production techniques of SiC devices. By following the above procedure and introducing in the molten bath traces of group III elements such as Al, Ga, In, or B in an amount up to 1% of the total molten bath, P-type cubic SiC LPE layers will form. Similarly, by introducing in the molten bath traces of group V dopants such as P, N, As, Fe, N-type cubic SiC LPE layers will form. By changing the above-mentioned dopants many times, homojunctions can be formed such as P-N-P or N-P-N, for instance. Additionally, since the preforms (CVD cubic SiC substrates that are used as seeds for the LPE process) can be doped during the CVD process with Al, for instance, using $Al(CH_3)_3$ in an amount of 0.1–0.01% of the entire gaseous mixture to form a P-type (seed) substrate, many different alternatives exist for the making of electronically active devices. Without dopants introduced into the CVD process, it has been found that the SiC layer on the preforms is routinely n-type.

Obviously, numerous modifications and variations in the practice of the present invention are possible in light of the above teachings. It is therefore to be understood that within the scope of the appended claims, the invention may be practiced otherwise than as specifically described herein.

What is claimed and desired to be secured by Letters Patent of the United States is:

1. A method for making highly pure cubic SiC devices that is highly controllable and reproducible comprising the steps of:
   preparing a preform comprising a layer of high purity Si on which a layer of cubic SiC has been deposited;
   transferring the preform to a furnace containing a molten bath of Si saturated with SiC at a temperature of between 1600°–1800° C., the saturation being insured by the use of a crucible made of carbons as a container for the Si;

dipping the Si-SiC preform into the molten bath and allowing deposition of more cubic SiC on the SiC layer by reducing the temperature in the region of the preform in relation to the rest of the molten bath by some 20°–50° C.;

removing the cubic SiC layer with additional cubic SiC deposited on it from the molten bath.

2. A method as described in claim 1 wherein the cubic SiC layer in the preparing step is deposited by CVD.

3. A method as described in claim 2 wherein the crucible in the transferring step is made of high purity graphite.

4. A method as described in claim 3, which includes the additional step of eliminating any Si adhering to the surface of the cubic SiC layer after removal thereof from the molten bath.

5. A method as described in claim 4, wherein the eliminating step comprises heating the cubic SiC layer to a temperature between 10° to 150° C. greater than the temperature of the molten bath.

6. A method as described in claim 5, wherein the eliminating step comprises washing the cubic SiC layer with hydrofluoric acid, or HF+HNO$_3$ mixtures.

7. A method as described in claim 5 wherein the eliminating step comprises rotating rapidly the spindle with the cubic SiC layers about the axis of the spindle at temperatures higher than the molten bath of silicon.

8. A method for making highly pure cubic SiC devices that is highly controllable and reproducible comprising the steps of:

preparing a two-layer preform consisting of a layer of high purity Si in contact with a layer of cubic SiC having a P-type dopant;

transferring the preform to a furnace containing a molten bath of pure Si saturated with SiC and an N-type dopant at a temperature of between 1600°–1800° C., the SiC saturation being insured by the use of a high purity graphite crucible for container of the pure Si, said N-type dopant being a fraction of 1% of the total molten bath;

dipping the preform into the molten bath and allowing deposition of one more cubic SiC layers by reducing the temperature of the preform in relation to the rest of the molten bath by some 20°–60° C.;

removing the cubic SiC structure thus formed from the molten bath;

eliminating any Si adhering to the surface of the cubic SiC layer after removal thereof from the molten bath; and repeating the above steps starting from the transferring step with the molten bath now containing a P-type dopant in an amount no greater than 1% of the total molten Si by weight in order to create SiC homojunctions.

9. A method as described in claim 8 which includes the step of repeating the transferring step, the dipping step, the removing step, the eliminating step and the repeating step of claim 8 at least once in order to create SiC homojunctions.

10. A method as described in claim 9 wherein the N-type dopant used in the molten bath in the transferring step and the dipping step is a group V element and the P-type dopant used in the molten bath in the transferring step and the dipping step is a group III element.

11. A method as described in claim 9 wherein the P-type dopant used in the preparing step is Al(CH$_3$)$_3$, the N-type dopant used in the molten bath in the transferring step and the dipping step is either phosphorus, arsenic, nitrogen, or iron; and the P-type dopant used in the transferring step and the dipping step is either aluminum, gallium, indium, or boron.

12. A method for making highly pure cubic SiC devices that is highly controllable and reproducible comprising the steps of:

preparing a preform consisting of a layer of high purity Si on which a layer of cubic SiC has been deposited by CVD;

transferring the preform to a furnace containing a molten bath of Si saturated with SiC and a P-type dopant at a temperature of between 1600°–1800° C., the saturation being insured by the use of a container of high purity graphite crucible for the Si, said P-type dopant being no greater than 1% of the total molten Si;

dipping the Si-SiC preform into the molten bath and allowing deposition of more cubic SiC on the SiC layer by reducing the temperature of the already formed cubic SiC layer from the preparing step in relation to the rest of the molten bath;

removing the cubic SiC structure so obtained, from the molten bath;

eliminating any Si adhering to the surface of the cubic SiC layer after removal thereof from the molten bath; and repeating the above steps starting from the transferring step with the molten bath now containing an N-type dopant in an amount no greater than 1% of the total molten Si in order to create SiC homojunctions.

13. A method as described in claim 12 which includes the step of repeating the transferring step, the dipping step, the removing step, the eliminating step and the repeating step at least once, in order to create SiC homojunctions.

14. A method as described in claim 13 wherein the N-type dopant used in the in the transferring step and in the dipping step is a group V element and the P-type dopant is a group III element.

15. A method as described in claim 13 wherein the N-type dopant used in the molten bath in the transferring step and the dipping step is either phosphorus, arsenic, nitrogen, or iron; and the P-type dopant used in the transferring step and the dipping step is either aluminum, gallium, indium, or boron.

* * * * *